United States Patent
Yan et al.

(10) Patent No.: US 8,368,088 B2
(45) Date of Patent: Feb. 5, 2013

(54) LIGHT-EMITTING DEVICE AND METHOD MANUFACTURING THE SAME

(75) Inventors: Jing-Yi Yan, Zhubei (TW); Jung-Jie Huang, Citong Township, Yunlin County (TW); Shu-Tang Yeh, Tanzi Township, Taichung County (TW); Yen-Shih Huang, Hsinchu (TW); Hung-Chien Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 225 days.

(21) Appl. No.: 12/976,251

(22) Filed: Dec. 22, 2010

(65) Prior Publication Data
US 2012/0061689 A1    Mar. 15, 2012

(30) Foreign Application Priority Data
Sep. 10, 2010  (TW) ................. 99130763 A

(51) Int. Cl.
*H01L 31/167*    (2006.01)
*H01L 31/18*    (2006.01)
(52) U.S. Cl. ....... 257/84; 257/99; 257/40; 257/E33.077; 438/24; 438/26

(58) Field of Classification Search .............. 257/84, 257/E33.077, 99, 40; 438/24, 26
See application file for complete search history.

(56) References Cited

U.S. PATENT DOCUMENTS

| | | |
|---|---|---|
| 2007/0102035 A1 | 5/2007 | Yang |
| 2008/0094025 A1 | 4/2008 | Rosenblatt et al. |
| 2008/0163923 A1 | 7/2008 | Park et al. |
| 2009/0108757 A1 | 4/2009 | Lee et al. |
| 2011/0017295 A1* | 1/2011 | Yu et al. ............. 136/259 |

* cited by examiner

*Primary Examiner* — Cuong Q Nguyen
*Assistant Examiner* — Cathy N Lam
(74) *Attorney, Agent, or Firm* — Muncy, Geissler, Olds & Lowe, PLLC

(57) ABSTRACT

A light-emitting device and a method for manufacturing the same are provided. The light-emitting device comprises a substrate, a light-emitting element and a light-electricity-transforming element. The substrate has a first region and a second region which are non-overlapping. The light-emitting element is disposed over the substrate and located in the second region. The light-electricity-transforming element is disposed over the substrate and located in the first region. At least a portion of a side wall of the light-electricity-transforming element corresponds to at least a portion of a side wall of the light-emitting element, so that at least a side light from the light-emitting element is received and transformed into an electricity power by the light-electricity-transforming device.

25 Claims, 9 Drawing Sheets

US 8,368,088 B2

LIGHT-EMITTING DEVICE AND METHOD MANUFACTURING THE SAME

This application claims the benefit of Taiwan application Ser. No. 099130763, filed on Sep. 10, 2010, the subject matter of which is incorporated therein by reference.

BACKGROUND

1. Technical Field

The disclosure relates in general to a light-emitting device and a method for manufacturing the same, and more particularly to a light-emitting device with light-emitting element and a method for manufacturing the same.

2. Description of the Related Art

The organic light emitting diode (OLED), commonly used in the display and the illumination facility, can be divided into the fluorescent material system and the phosphorescent material system. The theoretical value of quantum effect of the fluorescent material system is about 25%, and theoretical value of quantum effect of the phosphorescent material system can be near 100%.

Despite the OLED can increase the internal quantum effect by adjusting element structures, most of the actually measured quantum effect of the element are smaller than 20%, which is indeed very low. The low quantum effect is mainly ascribed to the following reasons. First, the light emitted by the OLED is an isotropic light, which is emitted upwards, downwards, and laterally. Second, before reaching the display surface or the external, the light emitted by the OLED has to pass through or contact other structures of the device, and thus many of the lights are diffracted or deflected to unexpected paths. About 80% of the light generated by the OLED will be wasted in the device, not only deteriorating the optical performance of the light-emitting device but also wasting the generated light energy. This is indeed a waste of energy and by no means environmental friendly.

SUMMARY

The disclosure is directed to a light-emitting device and a method for manufacturing the same According to a first aspect of the disclosure, a light-emitting device is provided. The light-emitting device comprises a substrate, a light-emitting element and a light-electricity-transforming element. The substrate has a first region and a second region that are non-overlapping. The light-emitting element is disposed over the substrate and located in the second region. The light-electricity-transforming element is disposed over the substrate and located in the first region. At least a portion of a side wall of the light-electricity-transforming element corresponds to at least a portion of a side wall of the light-emitting element, so that at least a side light from the light-emitting element is received and transformed into an electricity power by the light-electricity-transforming device.

According to a second aspect of the disclosure, a method for manufacturing a light-emitting device is provided. The manufacturing method comprises the following steps. A substrate is provided. The substrate has a first region and a second region that are non-overlapping. A light-emitting element is formed over the substrate and located in the second region. A light-electricity-transforming element is formed over the substrate and located in the first region. At least a portion of a side wall of the light-electricity-transforming element corresponds to at least a portion of a side wall of the light-emitting element, so that at least a side light from the light-emitting element is received and transformed into an electricity power by the light-electricity-transforming device.

The above and other aspects of the disclosure will become better understood with regard to the following detailed description of the preferred but non-limiting embodiment(s). The following description is made with reference to the accompanying drawings.

DETAILED DESCRIPTION

The features and method of the disclosure are disclosed below with accompanying drawings. In the disclosure below, similar or identical elements used in different drawings are denoted by the same designations.

First Embodiment

Figure 1:
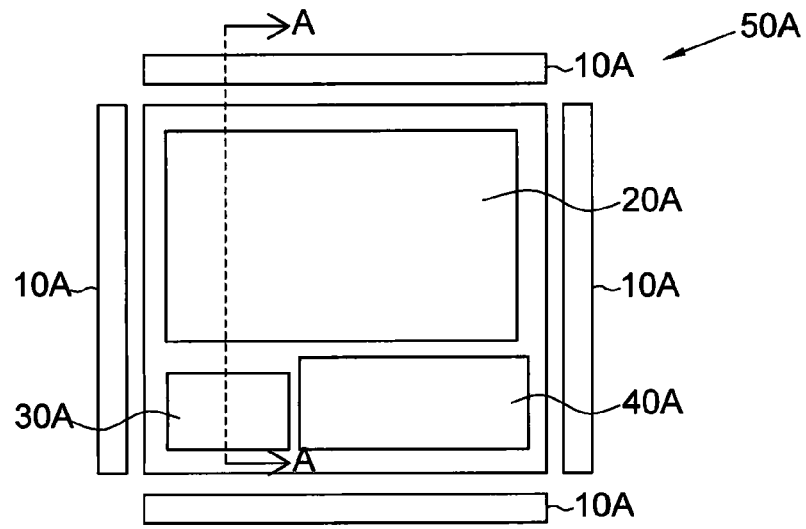
FIG. 1 shows a top view of a light-emitting device according to the first embodiment.
Figure 2:
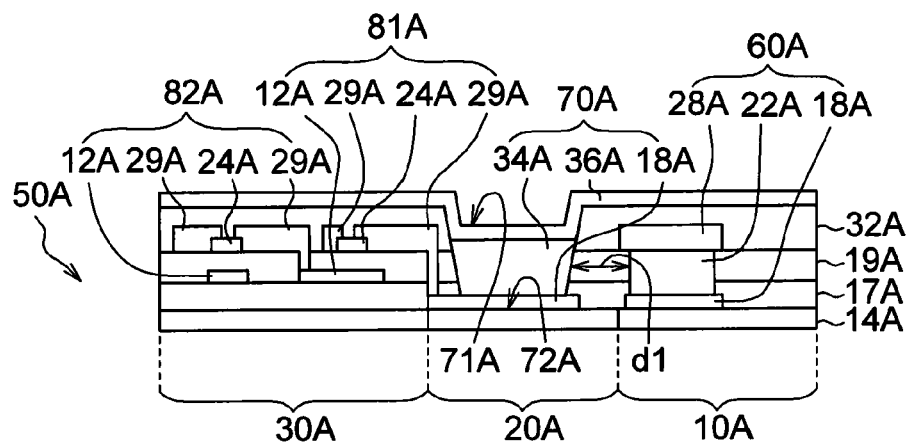
FIG. 2 shows a cross-sectional view of a light-emitting device according to the first embodiment.

FIG. 1 shows a top view of a light-emitting device 50A according to a first embodiment. FIG. 2 shows a cross-sectional view of the light-emitting device 50A of FIG. 1 viewed along a cross-section line AA. As indicated in FIG. 1 and FIG. 2, the light-emitting device 50A comprises a substrate 14A. For example, the substrate 14A comprises a first region 10A, a second region 20A, a third region 30A and a capacitor region 40A. The first region 10A, the second region 20A and the third region 30A are non-overlapping and located at different lateral positions of the substrate 14A.

Referring to FIG. 2, in the light-emitting device 50A, the light-electricity-transforming element 60A is located in the first region 10A and comprises, for example, a lower electrode layer 18A, an upper electrode layer 28A and a light-electricity-transforming layer 22A. The light-emitting element 70A is located in the second region 20A and comprises, for example, a lower electrode layer 18A, an upper electrode layer 36A and a light-emitting layer 34A. In one embodiment, the distance between the light-electricity-transforming element 60A and the light-emitting element 70A is smaller than 500 µm, that is, the distance $d_1$ between adjacent side walls of the light-emitting layer 34A and the light-electricity-transforming layer 22A is smaller than 500 µm. The transistors 81A and 82A are located in the third region 30A and respectively comprise, for example, a conductive layer 12A, a conductive layer 24A and a conductive layer 29A. In one embodiment, the light-emitting element 70A is an OLED. The transistors 81A and 82A are a switch transistor and a driving transistor, respectively. The switch transistor is used for turning on/off the driving transistor. The driving transistor is used for driving the OLED.

As indicated in FIG. 2, at least a portion of a side wall of the light-emitting element 70A corresponds to at least a portion of a side wall of the light-electricity-transforming element 60A, so that the light-electricity-transforming element 60A can effectively receive a side light emitted from the light-emitting element 70A. The light-electricity-transforming element 60A also can receive the light diffracted inside the device. Therefore, the light not emitted to the outside can be stored as a recyclable energy. The light-electricity-transforming element 60A, adjacent to the light-emitting element 70A, can receive a light with high intensity. Since the light-electricity-transforming element 60A does not block the path of the light emitted from a light-emitting surface 71A or 72A of the light-emitting element 70A, the display brightness of the light-emitting device 50A will not deteriorate.

As indicated in FIG. 1 and FIG. 2, for example, the first region 10A is disposed around the second region 20A. In other embodiments, the number and position of the first region 10A can be adjusted according to element design and circuit layout. The transistors 81A and 82A can also overlap the first region 10A (referring to FIG. 32 and FIG. 33) to increase the aperture ratio of the light-emitting device 50A.

In other embodiments, a reflection layer (not illustrated) can be disposed over a side wall of the light-electricity-transforming layer 22A away from the light-emitting layer 34A to increase the efficiency of the light. The reflection layer can also be disposed over the upper electrode layer 28A over the light-electricity-transforming layer 22A or disposed under the lower electrode layer 18A under the light-electricity-transforming layer 22A. To further increase the light reflection, a surface of a material over which the reflection layer is to be formed can be roughed by dry etching, wet etching or other suitable methods.

FIGS. 3-9 show a process in one embodiment for manufacturing the light-emitting device 50A of the first embodiment shown in FIG. 2.

Figure 3:
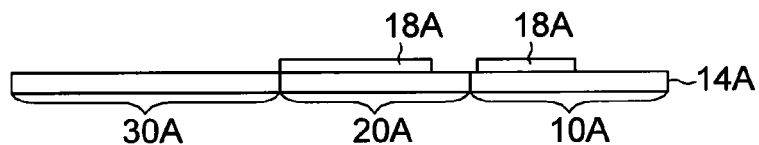
FIGS. 3-9 show a process in one embodiment for manufacturing a light-emitting device of the first embodiment.
Figure 4:
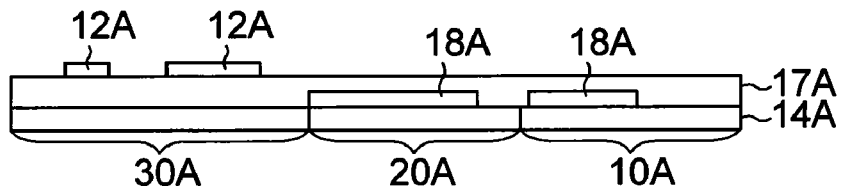
Figure 5:
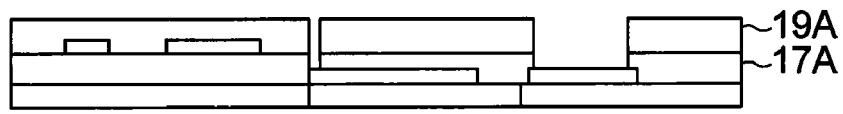

As indicated in FIG. 3, a lower electrode layer 18A is formed in the first region 10A and the second region 20A of the substrate 14A. As indicated in FIG. 4, an insulation layer 17A is formed over the substrate 14A. Then, a conductive layer 12A is formed over the insulation layer 17A in the third region 30A. As indicated in FIG. 5, an insulation layer 19A is formed over the insulation layer 17A. Next, an opening can be formed in the insulation layer 17A and the insulation layer 19A by photolithography and etching process.

Figure 6:
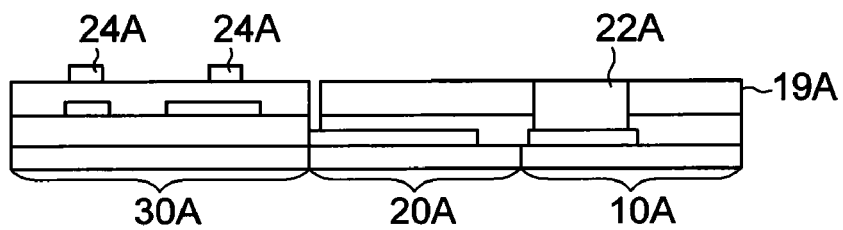

As indicated in FIG. 6, a conductive layer 24A is formed over the insulation layer 19A in the third region 30A. A light-electricity-transforming layer 22A is formed in the opening in the first region 10A. The light-electricity-transforming layer 22A may be formed by one single thin film or formed by stacking several thin films (not illustrated). The sequence in the formation of the light-electricity-transforming layer 22A and the conductive layer 24A is not limited. The light-electricity-transforming layer 22A and the conductive layer 24A can be concurrently formed by photolithographing and etching a formed thin film with a mask.

Figure 7:
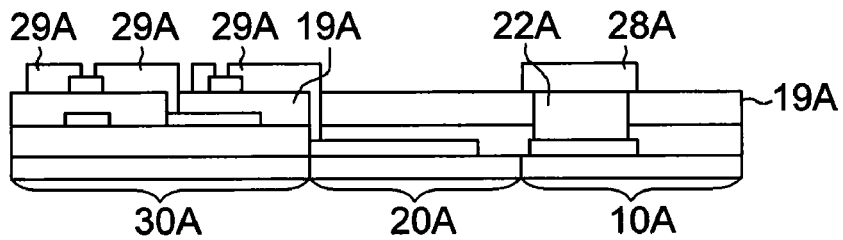

As indicated in FIG. 7, an upper electrode layer 28A is formed over the light-electricity-transforming layer 22A. A conductive layer 29A is formed over the insulation layer 19A in the third region 30A. In embodiments, the upper electrode layer 28A and the conductive layer 29A can be concurrently formed by photolithographing and etching a formed thin film with a mask. The upper electrode layer 28A and the conductive layer 29A may comprise the same material.

Figure 8:
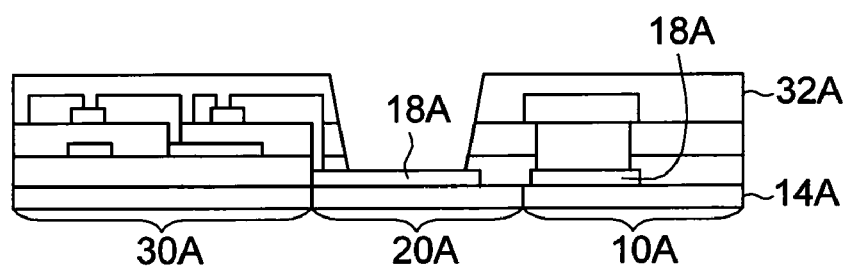
Figure 9:
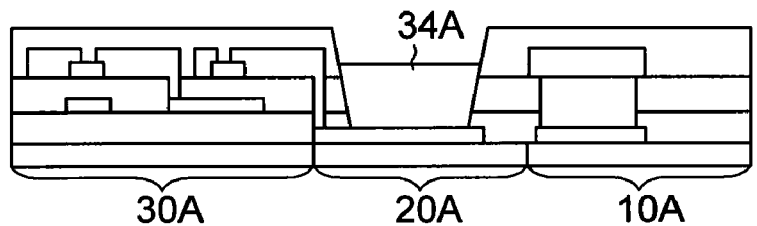

As indicated in FIG. 8, next, a protection layer 32A is formed over the substrate 14A, and an opening exposing the lower electrode layer 18A is formed over the second region 20A by photolithography and etching process. As indicated in FIG. 9, a light-emitting layer 34A is formed in the opening over the second region 20A. As indicated in FIG. 2, an upper electrode layer 36A is formed over the light-emitting layer 34A and the protection layer 32A.

According to the present embodiment, the light-emitting layer 34A and the upper electrode layer 36A are formed in the second region 20A after the protection layer 32A is formed in the first region 10A, so that the light-emitting element 70A is not affected by the manufacturing process of the light-electricity-transforming element 60A.

Second Embodiment

Figure 10:
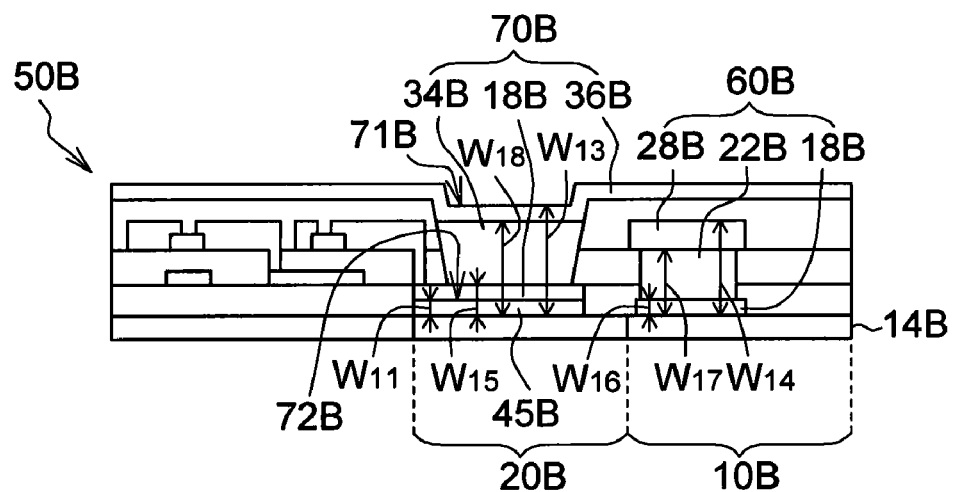
FIG. 10 shows a cross-sectional view of a light-emitting device according to the second embodiment.

FIG. 10 shows a cross-sectional view of a light-emitting device 50B according to a second embodiment. The light-emitting device 50B of the present embodiment is different from the light-emitting device 50A of the first embodiment in that the platform structure 45B is disposed, for example, between the lower electrode layer 18B of the second region 20B and the substrate 14B. Other similarities are not repeated. The platform structure 45B, which may comprise an insulating material, can be used for adjusting the relative position between the light-electricity-transforming element 60B (or the light-electricity-transforming layer 22B) and the light-emitting element 70B (or the light-emitting layer 34B), so that the light-electricity-transforming element 60B effectively receives a side light emitted from the light-emitting element 70B.

For example, the upper surface of the light-emitting element 70B (that is, the upper surface of the upper electrode layer 36B in the second region 20B) and the upper surface of the substrate 14B are spaced by a third distance W13. The lower surface of the light-emitting element 70B (that is, the lower surface of the lower electrode layer 18B in the second region 20B) and the upper surface of the substrate 14B are spaced by a first distance W11. The upper surface of the light-electricity-transforming element 60B (that is, the upper surface of the upper electrode layer 28B in the first region 10B) and the upper surface of the substrate 14B are spaced by a fourth distance W14. The fourth distance W14 ranges between the third distance W13 and the first distance W11. In one embodiment, the lower surface of the light-emitting layer 34B and the upper surface of the substrate 14B are spaced by a fifth distance W15. The upper surface of the light-emitting layer 34B and the upper surface of the substrate 14B are spaced by an eighth distance W18. The lower surface of the light-electricity-transforming layer 22B and the upper surface of the substrate 14B are spaced by a sixth distance W16. The upper surface of the light-electricity-transforming layer 22B and the upper surface of the substrate 14B are spaced by a seventh distance W17. The fifth distance W15 ranges between the sixth distance W16 and the seventh distance W17. The seventh distance W17 ranges between the fifth distance W15 and the eighth distance W18. In one embodiment, the first distance W11 is substantially equal to a second distance by which the lower surface of the light-electricity-transforming element 60B (that is, the lower surface of the lower electrode layer 18B in the first region 10B) and the upper surface of the substrate 14B are spaced (not shown).

The light-electricity-transforming element 60B can effectively receive a side light emitted from the light-emitting element 70B. In addition, the light-electricity-transforming element 60B also can receive a light diffracted inside the device. Therefore, the light not emitted to the outside can be stored as a recyclable energy. Since the light-electricity-transforming element 60B does not block the path of the light emitted from the light-emitting surface 71B or 72B of the light-emitting element 70B, the display brightness of the light-emitting device 50B will not deteriorate.

Third Embodiment

Figure 11:
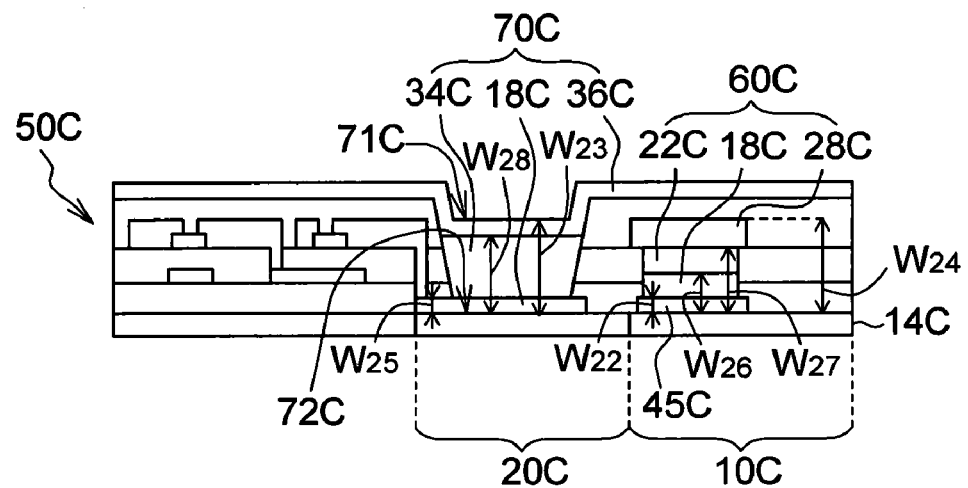
FIG. 11 shows a cross-sectional view of a light-emitting device according to the third embodiment.

FIG. 11 shows a cross-sectional view of a light-emitting device 50C according to a third embodiment. The light-emitting device 50C of the present embodiment of the disclosure is different from the light-emitting device 50A of the first embodiment in that a platform structure 45C is disposed, for example, between the lower electrode layer 18C of the first region 10C and the substrate 14C. Other similarities are not repeated. The platform structure 45C, which may comprise insulating material, can be used for adjusting the relative position between the light-electricity-transforming element 60C (or the light-electricity-transforming layer 22C) and the light-emitting element 70C (or the light-emitting layer 34C), so that the light-electricity-transforming element 60C effectively receives a side light emitted from the light-emitting element 70C.

For example, the upper surface of the light-emitting element 70C (that is, the upper surface of the upper electrode layer 36C in the second region 20C) and the upper surface of the substrate 14C are spaced by a third distance W23. The upper surface of the light-electricity-transforming element 60C (that is, the upper surface of the upper electrode layer 28C in the first region 10C) and the upper surface of the substrate 14C are spaced by a fourth distance W24. The lower surface of the light-electricity-transforming element 60C (that is, the lower surface of the lower electrode layer 18C in the first region 10C) and the upper surface of the substrate 14C are spaced by a second distance W22. The third distance W23 ranges between the fourth distance W24 and the second distance W22. In one embodiment, the lower surface of the light-emitting layer 34C and the upper surface of the substrate 14C are spaced by a fifth distance W25. The upper surface of the light-emitting layer 34C and the upper surface of the substrate 14C are spaced by an eighth distance W28. The lower surface of the light-electricity-transforming layer 22C and the upper surface of the substrate 14C are spaced by a sixth distance W26. The upper surface of the light-electricity-transforming layer 22C and the upper surface of the substrate 14C are spaced by a seventh distance W27. The sixth distance W26 ranges between the fifth distance W25 and the eighth distance W28. The seventh distance W27 ranges between the fifth distance W25 and the eighth distance W28. In one embodiment, the second distance W22 is substantially equal to a first distance by which the lower surface of the light-emitting element 70C (that is, the lower surface of the lower electrode layer 18C in the second region 20C) and the upper surface of the substrate 14C are spaced (not shown).

The light-electricity-transforming element 60C can effectively receive a side light emitted from the light-emitting element 70C. In addition, the light-electricity-transforming element 60C also can receive the light diffracted inside the device. Therefore, the light not emitted to the outside can be stored as a recyclable energy. Since the light-electricity-transforming element 60C does not block the path of the light emitted from the light-emitting surface 71C or 72C of the light-emitting element 70C, the display brightness of the light-emitting device 50C will not deteriorate.

Fourth Embodiment

Figure 12:
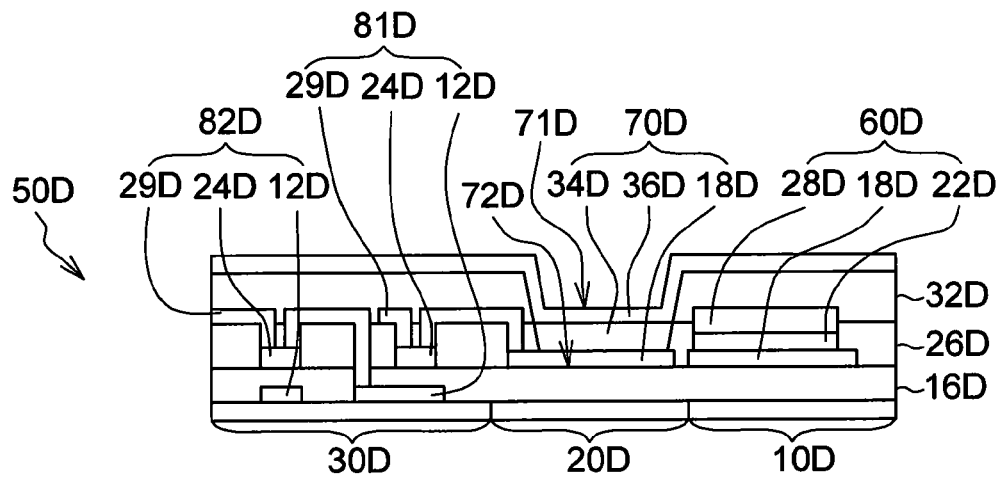
FIG. 12 shows a cross-sectional view of a light-emitting device according to the fourth embodiment.

FIG. 12 shows a cross-sectional view of a light-emitting device 50D according to a fourth embodiment. As indicated in FIG. 12, the light-emitting device 50D has the light-electricity-transforming element 60D, the light-emitting element 70D and the transistors 81D and 82D that are arranged by the way different from that of the light-emitting device 50A of the first embodiment. The light-electricity-transforming element 60D comprises a lower electrode layer 18D, an upper electrode layer 28D and a light-electricity-transforming layer 22D. The light-emitting element 70D comprises a lower electrode layer 18D, an upper electrode layer 36D and a light-emitting layer 34D. The transistors 81D and 82D respectively comprise, for example, a conductive layer 12D, a conductive layer 24D and a conductive layer 29D. For example, the light-emitting device 50D also comprises an insulation layer 16D, an insulation layer 26D and a protection layer 32D. Other similarities are not repeated herein.

As indicated in FIG. 12, at least a portion of a side wall of the light-emitting element 70D corresponds to at least a portion of a side wall of the light-electricity-transforming element 60D, so that the light-electricity-transforming element 60D can effectively receive a side light emitted from the light-emitting element 70D. The light-electricity-transforming element 60D can also receive a light source diffracted inside the device. Therefore, the light not emitted to the outside can be stored as a recyclable energy. The light-electricity-transforming element 60D, adjacent to the light-emitting element 70D, can receive a light with high intensity. Since the light-electricity-transforming element 60D does not block the path of the light emitted from the light-emitting surface 71D or 72D of the light-emitting element 70D, the display brightness of the light-emitting device 50D will not deteriorate.

FIGS. 13-20 show a process in one embodiment for manufacturing a light-emitting device 50D of the fourth embodiment shown in FIG. 12.

Figure 13:
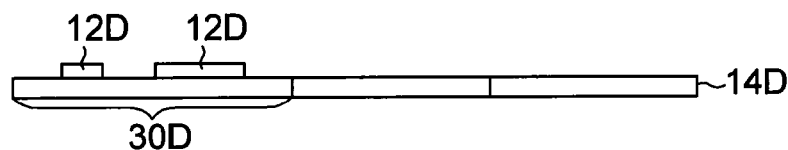
FIGS. 13-20 show a process in one embodiment for manufacturing a light-emitting device of the fourth embodiment.
Figure 14:
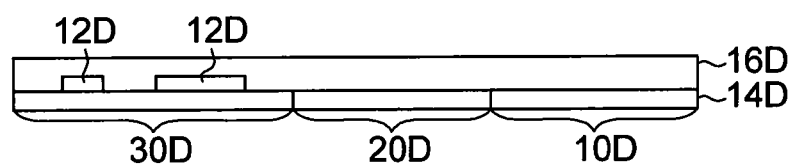
Figure 15:
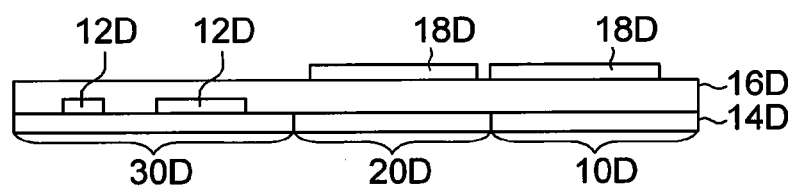
Figure 16:
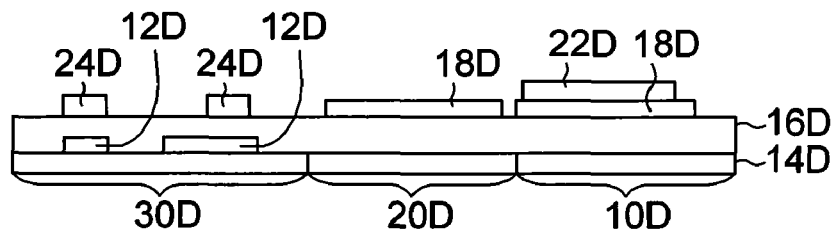

As indicated in FIG. 13, a conductive layer 12D is formed over the third region 30D of the substrate 14D. As indicated in FIG. 14, an insulation layer 16D is formed over the substrate 14D and the conductive layer 12D. As indicated in FIG. 15, a lower electrode layer 18D is formed over the insulation layer 16D in the first region 10D and the second region 20D. As indicated in FIG. 16, the light-electricity-transforming layer 22D is formed over the lower electrode layer 18D of the first region 10D, and a conductive layer 24D is formed over the insulation layer 16D of the third region 30D. The sequence in the formation of the light-electricity-transforming layer 22D and the conductive layer 24D is not limited. The light-electricity-transforming layer 22D and the conductive layer 24D can be concurrently formed by photolithographying and etching a formed thin film with a mask.

Figure 17:
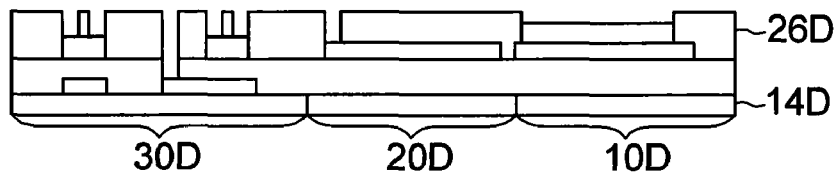
Figure 18:
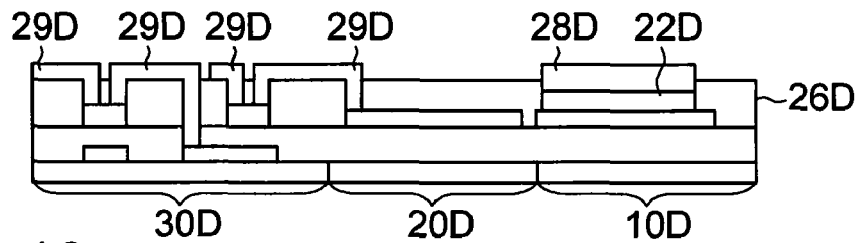
Figure 19:
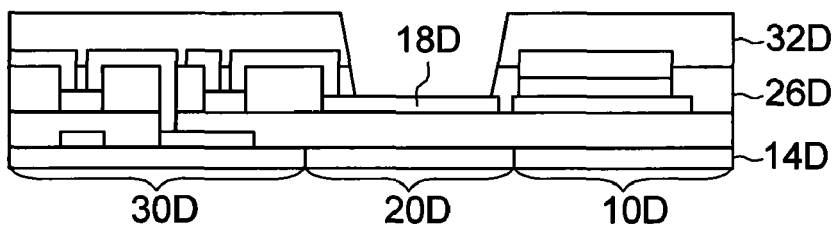
Figure 20:
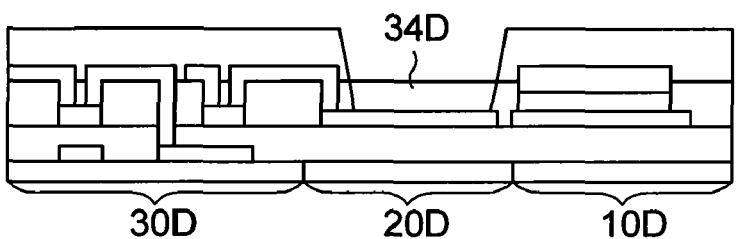

As indicated in FIG. 17, an insulation layer 26D is formed over the substrate 14D, and an opening is formed in the insulation layer 26D by photolithography and etching process. As indicated in FIG. 18, an upper electrode layer 28D is formed over the light-electricity-transforming layer 22D, and a conductive layer 29D is filled into the opening in the insulation layer 26D in the second region 20D and the third region 30D. As indicated in FIG. 19, a protection layer 32D is formed over the substrate 14D. Then, an opening exposing the lower electrode layer 18D is formed in the protection layer 32D and the insulation layer 26D of the second region 20D. As indicated in FIG. 20, a light-emitting layer 34D is formed in the opening of the second region 20D. As indicated in FIG. 12, an upper electrode layer 36D is formed over the light-emitting layer 34D. The upper electrode layer 36D can be extended to be over the protection layer 32D.

Fifth Embodiment

Figure 21:
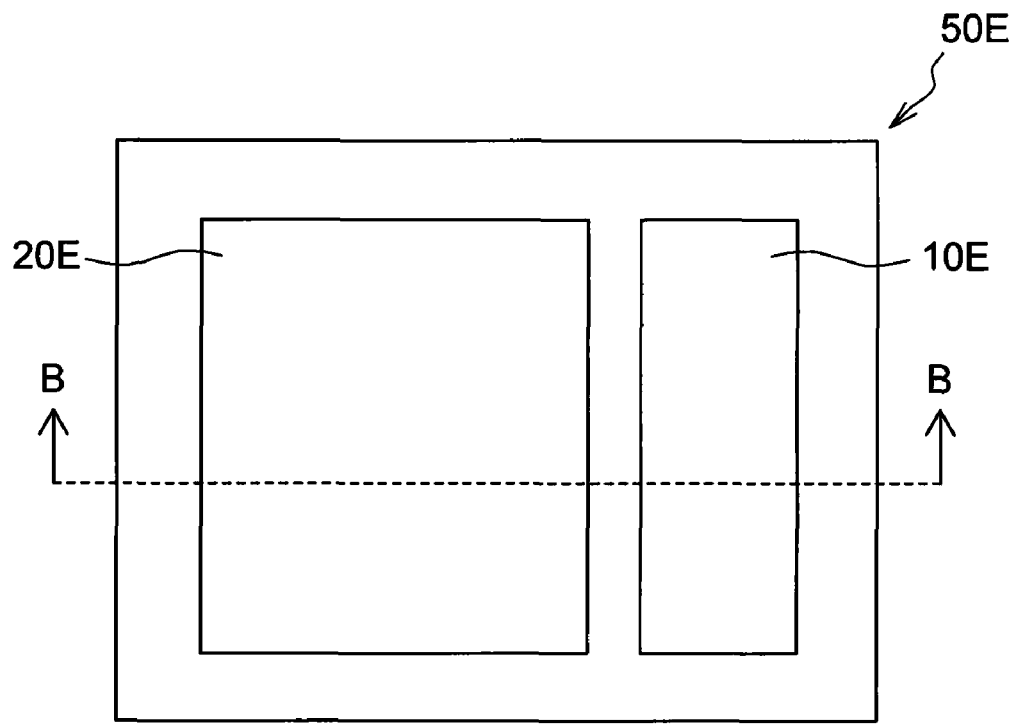
FIG. 21 shows a top view of a light-emitting device according to the fifth embodiment.
Figure 22:
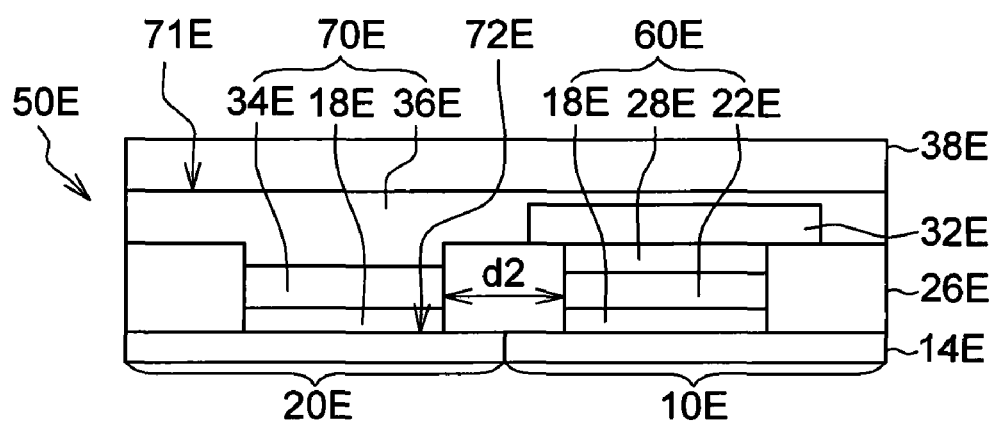
FIG. 22 shows a cross-sectional view of a light-emitting device according to the fifth embodiment.

FIG. 21 shows a top view of a light-emitting device 50E according to a fifth embodiment. FIG. 22 shows a cross-sectional view of the light-emitting device 50E of FIG. 21 viewed along a cross-section line BB. As indicated in FIG. 22, the light-emitting device 50E comprises a substrate 14E. For example, the substrate 14E comprises a first region 10E and a second region 20E that are non-overlapping and located at different horizontal positions of the substrate 14E.

Referring to FIG. 22, in the light-emitting device 50E, the light-electricity-transforming element 60E is located in the first region 10E and comprises, for example, a lower electrode layer 18E, an upper electrode layer 28E and a light-electricity-transforming layer 22E. The light-emitting element 70E is located in the second region 20E and comprises, for example, a lower electrode layer 18E, an upper electrode layer 36E and a light-emitting layer 34E. In one embodiment, the distance between the light-electricity-transforming element 60E and the light-emitting element 70E is smaller than 500 µm, that is, the distance $d_2$ between the adjacent side walls of the light-emitting layer 34E and the light-electricity-transforming layer 22E is smaller than 500 µm. For example, the light-emitting device 50E further comprises an insulation layer 26E, a protection layer 32E, and a sealing layer 38E.

As indicated in FIG. 22, at least a portion of a side wall of the light-emitting element 70E corresponds to at least a portion of a side wall of the light-electricity-transforming element 60E, so that the light-electricity-transforming element 60E can effectively receive a side light emitted from the light-emitting element 70E. The light-electricity-transforming element 60E also can receive the light source diffracted inside the device.

Therefore, the light not emitted to the outside can be stored as a recyclable energy. The light-electricity-transforming element 60E, adjacent to the light-emitting element 70E, can receive a light source with high intensity. Since the light-electricity-transforming element 60E does not block the path of the light emitted from the light-emitting surface 71E or 72E of the light-emitting element 70E, the display brightness of the light-emitting device 50E will not deteriorate.

In other embodiments, the reflection layer (not illustrated) can be disposed over the side wall of the light-electricity-transforming layer 22E away from the light-emitting layer 34E to increase the efficiency of the light. The reflection layer can also be disposed over the upper electrode layer 28E over the light-electricity-transforming layer 22E or disposed under the lower electrode layer 18E under the light-electricity-transforming layer 22E. To further increase the light reflection, a surface of a material over which the reflection layer is to be formed can be roughed by dry etching, wet etching or other suitable methods.

In addition, a suitable platform structure (not illustrated) can be disposed under the lower electrode layer 18E for adjusting the relative position between the light-electricity-transforming layer 22E and the light-emitting layer 34E, so that the light-electricity-transforming layer 22E can effectively receive a side light emitted from the light-emitting layer 34E. Related concepts are disclosed in FIG. 10 and FIG. 11, and are not repeated herein.

FIGS. 23-27 show a process in one embodiment for manufacturing the light-emitting device 50E of the fifth embodiment shown in FIG. 22.

Figure 23:
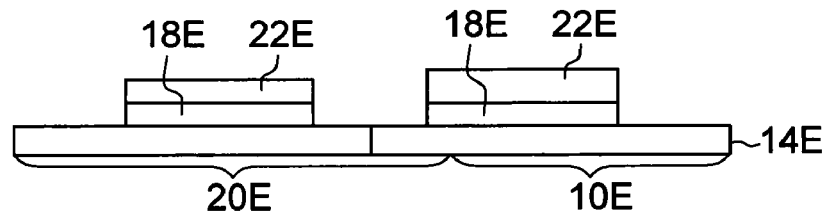
FIGS. 23-27 show a process in one embodiment for manufacturing a light-emitting device of the fifth embodiment.
Figure 24:
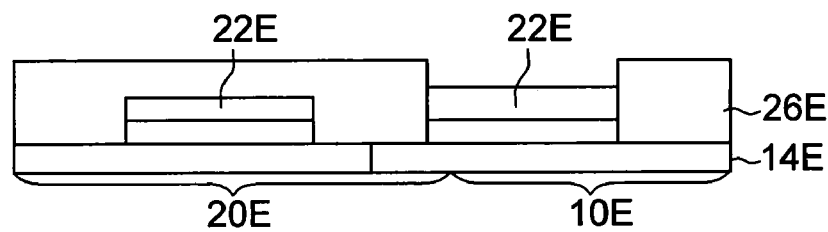
Figure 25:
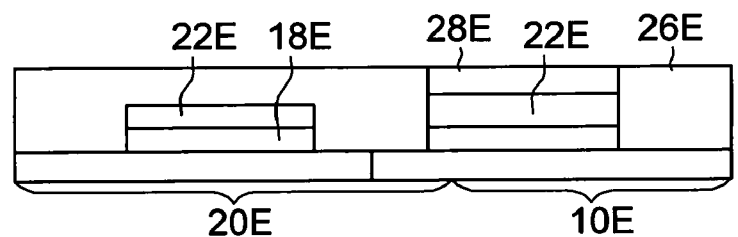
Figure 26:
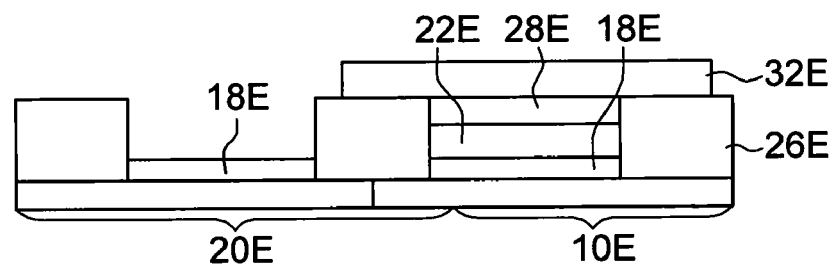
Figure 27:
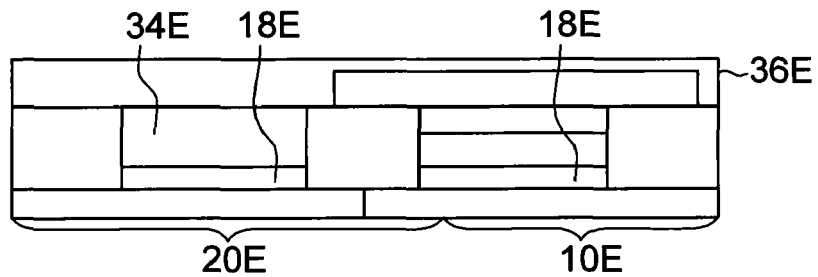

As indicated in FIG. 23, a lower electrode layer 18E and a light-electricity-transforming layer 22E are formed over the substrate 14E. As indicated in FIG. 24, an insulation layer 26E is formed over the substrate 14E, and an opening exposing the light-electricity-transforming layer 22E of the first region 10E is formed in the insulation layer 26E. As indicated in FIG. 25, an upper electrode layer 28E is formed over the light-electricity-transforming layer 22E of the first region 10E. As indicated in FIG. 26, the light-electricity-transforming layer 22E and the insulation layer 26E over the lower electrode layer 18E of the second region 20E are removed, and a protection layer 32E is formed over the upper electrode layer 28E. As indicated in FIG. 27, the light-emitting layer 34E and the upper electrode layer 36E are sequentially formed over the lower electrode layer 18E of the second region 20E. Next, the light-emitting device 50E as shown in FIG. 22 is completed after a sealing layer 38E is formed over the upper electrode layer 36E.

Figure 28:
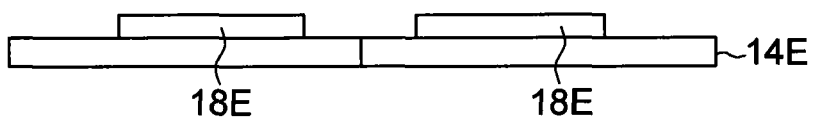
FIGS. 28-31 show a part of a process in one embodiment for manufacturing a light-emitting device of the fifth embodiment.
Figure 29:
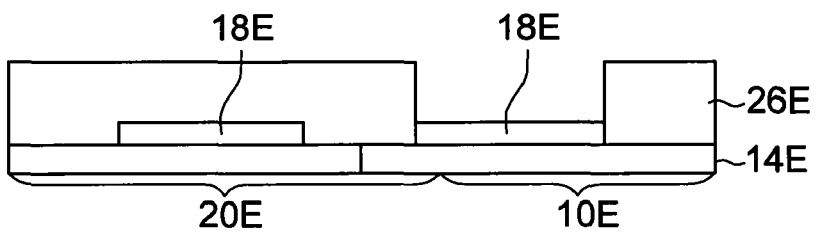

The process of one another embodiment for manufacturing the light-emitting device 50E of FIG. 22 is disclosed in FIGS. 28-31 and FIGS. 26-27 sequentially. As indicated in FIG. 28, a lower electrode layer 18E is formed over the substrate 14E. As indicated in FIG. 29, an insulation layer 26E is formed over the substrate 14E. An opening exposing the lower electrode layer 18E of the first region 10E is formed in the insulation layer 26E.

Figure 30:
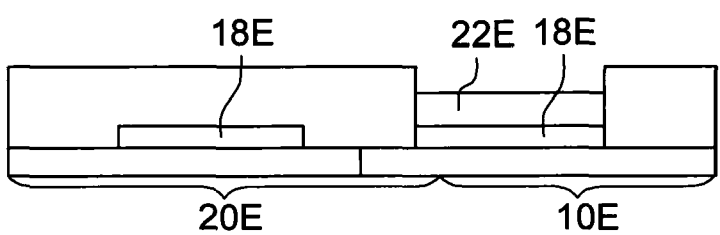
Figure 31:
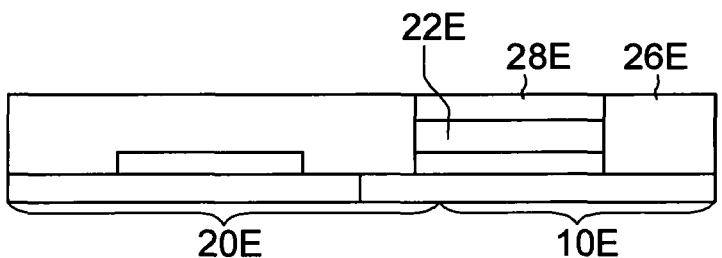

As indicated in FIG. 30, a light-electricity-transforming layer 22E is formed over the lower electrode layer 18E of the first region 10E. As indicated in FIG. 31, an upper electrode layer 28E is formed over the light-electricity-transforming layer 22E. As indicated in FIG. 26, the insulation layer 26E over the lower electrode layer 18E of the second region 20E is removed, and a protection layer 32E is formed over the upper electrode layer 28E. As indicated in FIG. 27, the light-emitting layer 34E and the upper electrode layer 36E are sequentially formed over the lower electrode layer 18E of the second region 20E. Lastly, the light-emitting device 50E shown in FIG. 22 is completed after a sealing layer 38E is formed over the upper electrode layer 36E.

Sixth Embodiment

Figure 32:
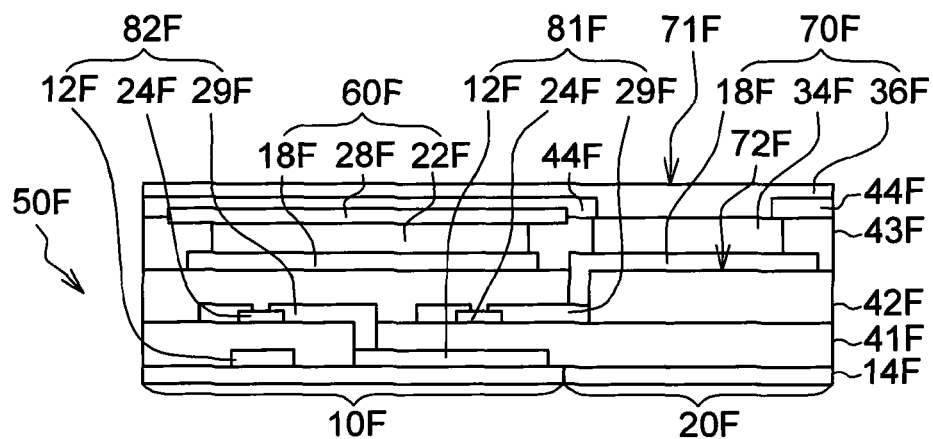
FIG. 32 shows a cross-sectional view of an energy recyclable light-emitting device according to the sixth embodiment.

FIG. 32 shows a cross-sectional view of an energy recyclable light-emitting device 50F according to a sixth embodiment. In the light-emitting device 50F, the light-emitting element 70F is located in the second region 20F and comprises, for example, a lower electrode layer 18F, an upper electrode layer 36F and a light-emitting layer 34F. The light-electricity-transforming element 60F is located in the first region 10F and comprises, for example, a lower electrode layer 18F, an upper electrode layer 28F and a light-electricity-transforming layer 22F. The transistors 81F and 82F are also located in the first region 10F, and respectively comprise, for example, a conductive layer 12F, a conductive layer 24F and a conductive layer 29F. In one embodiment, the light-emitting element 70F is an OLED, and the transistors 81F and 82F are a switch transistor and a driving transistor, respectively. The switch transistor is used for turning on/off the driving transistor. The driving transistor is used for driving the OLED.

As indicated in FIG. 32, in the present embodiment, the transistors 81F and 82F and the light-electricity-transforming element 60F are all located in the first region 10F, so that the transistors 81F and 82F will not occupy an area of the substrate 14F over which the light-electricity-transforming element 60F and the light-emitting element 70F are not disposed. The light-emitting device 50F can further comprises insulation layers 41F, 42F, 43F, and 44F.

As indicated in FIG. 32, at least a portion of a side wall of the light-emitting element 70F corresponds to at least a portion of a side wall of the light-electricity-transforming element 60F, so that the light-electricity-transforming element 60F can effectively receive a side light emitted from the light-emitting element 70F. The light-electricity-transforming element 60F also can receive the light source diffracted inside the device. Therefore, the light not emitted to the outside can be stored as a recyclable energy. The light-electricity-transforming element 60F, adjacent to the light-emitting element 70F, can receive a light with high intensity. Since the light-electricity-transforming element 60F does not block the path of the light emitted from the light-emitting surface 71 F or 72F of the light-emitting element 70F, the display brightness of the light-emitting device 50F will not deteriorate.

Seventh Embodiment

Figure 33:
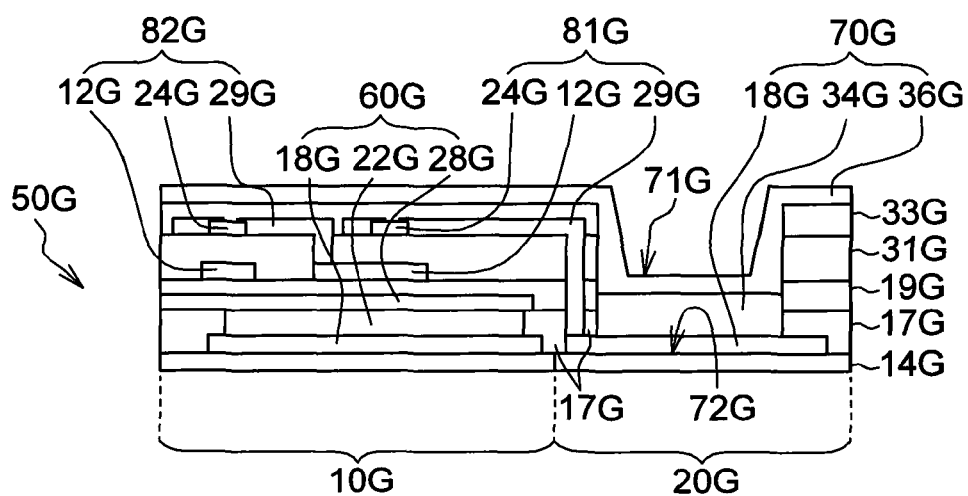
FIG. 33 shows a cross-sectional view of an energy recyclable light-emitting device according to the seventh embodiment.

FIG. 33 shows a cross-sectional view of an energy recyclable light-emitting device 50G according to the seventh embodiment. In the light-emitting device 50G, the light-emitting element 70G is located in the second region 20G and comprises, for example, a lower electrode layer 18G, an upper electrode layer 36G and a light-emitting layer 34G. The light-electricity-transforming element 60G is located in the first region 10G and comprises, for example, a lower electrode layer 18G, an upper electrode layer 28G and a light-electricity-transforming layer 22G. The transistors 81G and 82G, which also are located in the first region 10G, respectively comprise, for example, a conductive layer 12G, a conductive layer 24G and a conductive layer 29G. In one embodiment, the light-emitting element 70G is an OLED, and the transistors 81G and 82G are a switch transistor and a driving transistor, respectively. The switch transistor is used for turning on/off the driving transistor. The driving transistor is used for driving the OLED. As indicated in FIG. 33, in the present embodiment, the transistors 81G and 82G and the light-electricity-transforming element 60G are all located in the first region 10G, so that the transistors 81G and 82G will not occupy an area of the substrate 14G over which the light-electricity-transforming element 60G and the light-emitting element 70G are not disposed. The light-emitting device 50G can further comprises an insulation layer 17G, an insulation layer 19G, an insulation layer 31G, an insulation layer 33G.

As indicated in FIG. 33, at least a portion of a side wall of the light-emitting element 70G corresponds to at least a portion of a side wall of the light-electricity-transforming element 60G, so that the light-electricity-transforming element 60G can effectively receive a side light emitted from the light-emitting element 70G. The light-electricity-transforming element 60G also can receive the light diffracted inside the device. Therefore, the light not emitted to the outside can be stored as a recyclable energy. The light-electricity-transforming element 60G, adjacent to the light-emitting element 70G, can receive a light with high intensity. Since the light-electricity-transforming element 60G does not block the path of the light emitted from the light-emitting surfaces 71G and 72G of the light-emitting element 70G, the display brightness of the light-emitting device 50G will not deteriorate.

The light-emitting element of the above embodiments can be realized by such as an OLED, an LED or a backlight source of a LCD. The light-electricity-transforming element can be realized by such as an inorganic solar cell or an organic solar cell. The inorganic solar cell comprises but is not limited to a silicon thin film solar cell or a GIGS thin film solar cell. The organic solar cell comprises but is not limited to a dye sensitized solar cell.

The light-emitting device can be applied in a display, an illumination system, or a backlight system such as a backlight system of a LCD. In addition, the concepts of the disclosure are also applicable to a wide range of application such as bottom emission, top emission see-through display or illumination facility.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting device, comprising:
   a substrate having a first region and a second region, wherein the first region and the second region are non-overlapping;
   a light-emitting element disposed over the substrate and located in the second region; and
   a light-electricity-transforming element disposed over the substrate and located in the first region, wherein at least a portion of a side wall of the light-electricity-transforming element corresponds to at least a portion of a side wall of the light-emitting element, so that at least a side light from the light-emitting element is received and transformed into an electricity power by the light-electricity-transforming device.

2. The light-emitting device according to claim 1, wherein the substrate further comprises a third region, which does not overlap the second region and the first region, and the light-emitting device further comprises:
   at least a transistor disposed over the substrate and located in the third region.

3. The light-emitting device according to claim 1, further comprises:
   at least a transistor disposed over the substrate and located in the first region.

4. The light-emitting device according to claim 1, wherein the light-emitting element and the light-electricity-transforming element are substantially disposed over the same plane.

5. The light-emitting device according to claim 1, wherein the light-emitting element and the light-electricity-transforming element contact a plane of the same insulation layer.

6. The light-emitting device according to claim 1, wherein a lower surface of the light-emitting element and an upper surface of the substrate are spaced by a first distance, a lower surface of the light-electricity-transforming element and an upper surface of the substrate are spaced by a second distance, and the first distance is substantially equal to the second distance.

7. The light-emitting device according to claim 1, wherein an upper surface of the light-emitting element and an upper surface of the substrate are spaced by a third distance, a lower surface of the light-emitting element and an upper surface of the substrate are spaced by a first distance, an upper surface of the light-electricity-transforming element and an upper surface of the substrate are spaced by a fourth distance, and the fourth distance ranges between the first distance and the third distance.

8. The light-emitting device according to claim 1, wherein an upper surface of the light-emitting element and an upper surface of the substrate are spaced by a third distance, an upper surface of the light-electricity-transforming element and an upper surface of the substrate are spaced by a fourth distance, a lower surface of the light-electricity-transforming element and an upper surface of the substrate are spaced by a second distance, and the third distance ranges between the second distance and the fourth distance.

9. The light-emitting device according to claim 1, wherein the light-emitting element comprises a light-emitting layer, the light-electricity-transforming element comprises a light-electricity-transforming layer, a lower surface of the light-emitting layer and an upper surface of the substrate are spaced by a fifth distance, a lower surface of the light-electricity-transforming layer and an upper surface of the substrate are spaced by a sixth distance, an upper surface of the light-electricity-transforming layer and an upper surface of the substrate are spaced by a seventh distance, and the fifth distance ranges between the sixth distance and the seventh distance.

10. The light-emitting device according to claim 1, wherein the light-emitting element comprises a light-emitting layer, the light-electricity-transforming element comprises a light-electricity-transforming layer, a lower surface of the light-emitting layer and an upper surface of the substrate are spaced by a fifth distance, an upper surface of the light-electricity-transforming layer and an upper surface of the substrate are spaced by a seventh distance, an upper surface of the light-emitting layer and an upper surface of the substrate are spaced by an eighth distance, and the seventh distance ranges between the fifth distance and the eighth distance.

11. The light-emitting device according to claim 1, wherein the light-emitting element comprises a light-emitting layer, the light-electricity-transforming element comprises a light-electricity-transforming layer, a lower surface of the light-emitting layer and an upper surface of the substrate are spaced by a fifth distance, a lower surface of the light-electricity-transforming layer and an upper surface of the substrate are spaced by a sixth distance, an upper surface of the light-emitting layer and an upper surface of the substrate are spaced by an eighth distance, and the sixth distance ranges between the fifth distance and the eighth distance.

12. The light-emitting device according to claim 1, wherein the first region is disposed around the second region.

13. A manufacturing method of a light-emitting device, comprising:
providing a substrate, wherein the substrate has a first region and a second region which are non-overlapping;
forming a light-emitting element over the substrate and located in the second region; and
forming a light-electricity-transforming element over the substrate and located in the first region, at least a portion of a side wall of the light-electricity-transforming element corresponds to at least a portion of a side wall of the light-emitting element so that at least a side light from the light-emitting element is received and transformed into an electricity power by the light-electricity-transforming device.

14. The manufacturing method of light-emitting device according to claim 13,
wherein the step of forming the light-emitting element comprises:
forming a first lower electrode layer over the substrate;
forming a light-emitting layer over the first lower electrode layer; and
forming a first upper electrode layer over the light-emitting layer;
the step of forming the light-electricity-transforming element comprises:
forming a second lower electrode layer over the substrate;
forming a light-electricity-transforming layer over the second lower electrode layer; and
forming a second upper electrode layer over the light-electricity-transforming layer;
wherein the step of forming the first lower electrode layer and the step of forming the second lower electrode layer are performed concurrently.

15. The manufacturing method of light-emitting device according to claim 13, wherein the substrate further comprises a third region, which does not overlap the second region and the first region, and the manufacturing method of light-emitting device further comprises:
forming at least a transistor over the substrate and located in the third region.

16. The manufacturing method of light-emitting device according to claim 13, further comprises:
forming at least a transistor over the substrate and located in the first region.

17. The manufacturing method of light-emitting device according to claim 13, wherein in the step of forming the light-emitting element and the step of forming the light-electricity-transforming element, the light-emitting element and the light-electricity-transforming element are substantially formed over the same plane.

18. The manufacturing method of light-emitting device according to claim 13, wherein in a step of forming the light-emitting element and a step of forming the light-electricity-transforming element, the light-emitting element and the light-electricity-transforming element contact a plane of the same insulation layer.

19. The manufacturing method of light-emitting device according to claim 13, wherein in a step of forming the light-emitting element and a step of forming the light-electricity-transforming element, a lower surface of the light-emitting element and an upper surface of the substrate are spaced by a first distance, a lower surface of the light-electricity-transforming element and an upper surface of the substrate are spaced by a second distance, and the first distance is substantially equal to the second distance.

20. The manufacturing method of light-emitting device according to claim 13, wherein in a step of forming the light-emitting element and a step of forming the light-electricity-transforming element, an upper surface of the light-emitting element and an upper surface of the substrate are spaced by a third distance, a lower surface of the light-emitting element and an upper surface of the substrate are spaced by a first distance, an upper surface of the light-electricity-transforming element and an upper surface of the substrate are spaced by a fourth distance, and the fourth distance ranges between the first distance and the third distance.

21. The manufacturing method of light-emitting device according to claim 13, wherein in a step of forming the light-emitting element and a step of forming the light-electricity-transforming element, an upper surface of the light-emitting element and an upper surface of the substrate are spaced by a third distance, an upper surface of the light-electricity-transforming element and an upper surface of the substrate are spaced by a fourth distance, a lower surface of the light-electricity-transforming element and an upper surface of the substrate are spaced by a second distance, and the third distance ranges between the second distance and the fourth distance.

22. The manufacturing method of light-emitting device according to claim 13, wherein the first region is disposed around the second region.

23. The manufacturing method of light-emitting device according to claim 13, wherein in a step of forming the light-emitting element and a step of forming the light-electricity-transforming element, the light-emitting element comprises a light-emitting layer, the light-electricity-transforming element comprises a light-electricity-transforming layer, a lower surface of the light-emitting layer and an upper surface of the substrate are spaced by a fifth distance, a lower surface of the light-electricity-transforming layer and an upper surface of the substrate are spaced by a sixth distance, an upper surface of the light-electricity-transforming layer and an upper surface of the substrate are spaced by a seventh distance, and the fifth distance ranges between the sixth distance and the seventh distance.

24. The manufacturing method of light-emitting device according to claim 13, wherein in a step of forming the light-emitting element and a step of forming the light-electricity-transforming element, the light-emitting element comprises a light-emitting layer, the light-electricity-transforming element comprises a light-electricity-transforming layer, a lower surface of the light-emitting layer and an upper surface of the substrate are spaced by a fifth distance, an upper surface of the light-electricity-transforming layer and an upper surface of the substrate are spaced by a seventh distance, an upper surface of the light-emitting layer and an upper surface of the substrate are spaced by an eighth distance, and the seventh distance ranges between the fifth distance and the eighth distance.

25. The manufacturing method of light-emitting device according to claim 13, wherein in a step of forming the light-emitting element and a step of forming the light-electricity-transforming element, the light-emitting element comprises a light-emitting layer, the light-electricity-transforming element comprises a light-electricity-transforming layer, a lower surface of the light-emitting layer and an upper surface of the substrate are spaced by a fifth distance, a lower surface of the light-electricity-transforming layer and an upper surface of the substrate are spaced by a sixth distance, an upper surface of the light-emitting layer and an upper surface of the substrate are spaced by an eighth distance, and the sixth distance ranges between the fifth distance and the eighth distance.

* * * * *